United States Patent
Brandt et al.

(10) Patent No.: US 7,145,385 B2
(45) Date of Patent: Dec. 5, 2006

(54) SINGLE CHIP POWER AMPLIFIER AND ENVELOPE MODULATOR

(75) Inventors: Per-Olof Brandt, Lomma (SE); Jonas Persson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 91 days.

(21) Appl. No.: 10/869,987

(22) Filed: Jun. 17, 2004

(65) Prior Publication Data

US 2005/0122164 A1    Jun. 9, 2005

Related U.S. Application Data

(60) Provisional application No. 60/527,321, filed on Dec. 5, 2003.

(51) Int. Cl.
*H03F 3/38* (2006.01)

(52) U.S. Cl. .................... 330/10; 330/289; 330/297

(58) Field of Classification Search ............. 330/10, 330/297, 289
See application file for complete search history.

(56) References Cited

U.S. PATENT DOCUMENTS

| | | | |
|---|---|---|---|
| 6,043,707 A | | 3/2000 | Budnik |
| 6,566,944 B1 * | | 5/2003 | Pehlke et al. ............... 330/10 |
| 6,636,112 B1 * | | 10/2003 | McCune .................... 330/10 |
| 6,734,724 B1 * | | 5/2004 | Schell et al. ............... 330/10 |
| 2002/0077066 A1 | | 6/2002 | Pehlke et al. |
| 2003/0008845 A1 | | 1/2003 | Jorge et al. |
| 2003/0146792 A1 | | 8/2003 | Ausserlechner |

FOREIGN PATENT DOCUMENTS

| | | |
|---|---|---|
| DE | 101 50 476 A1 | 4/2003 |
| EP | 0 693 823 A | 1/1996 |
| EP | 1367710 A1 | 3/2003 |
| EP | 1387485 A1 | 2/2004 |
| WO | WO0237666 A2 | 5/2002 |
| WO | WO03103109 A2 | 12/2003 |

OTHER PUBLICATIONS

European Patent Office International Search Report dated Jun. 2, 2005.

* cited by examiner

*Primary Examiner*—Khanh Van Nguyen

(57) ABSTRACT

RF polar modulation circuit has a self-compensated temperature stable envelope controller and self-compensated temperature stable power amplifier bias. The circuit has an adaptive current-to-voltage modulation interface with pre-distortion compensation capability. AM/PM distortion are compensated for envelope dependent power amplifier transistor biasing. Automatic compensation is provided for RF loads that are higher or lower than nominal loads. This Abstract is provided to comply with rules requiring an Abstract that allows a searcher or other reader to quickly ascertain subject matter of the technical disclosure. This Abstract is submitted with the understanding that it will not be used to interpret or limit the scope or meaning of the claims. 37 CFR 1.72(b).

30 Claims, 8 Drawing Sheets

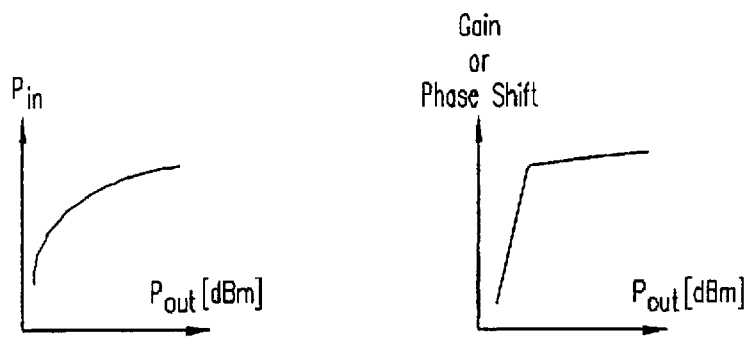
*FIG. 16*    *FIG. 17*
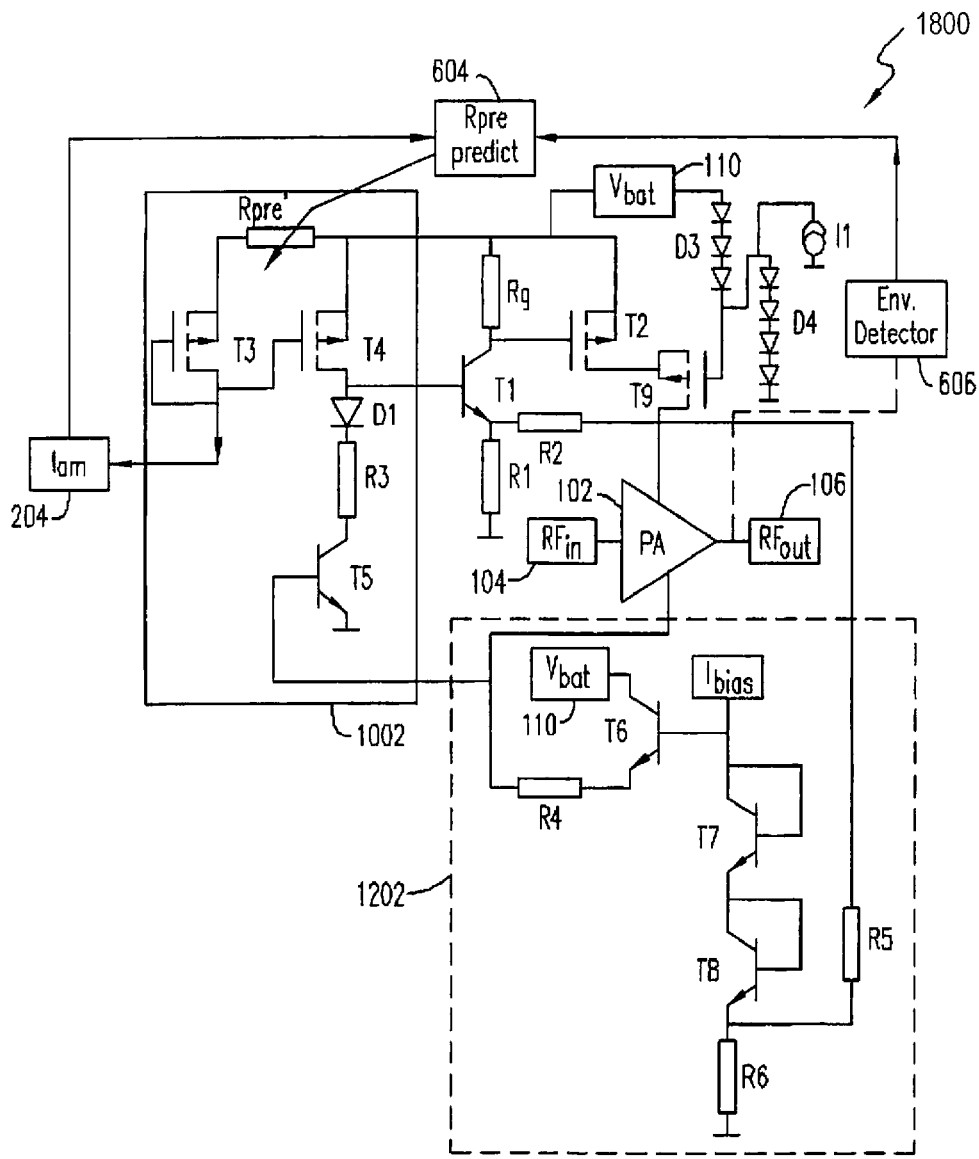
*FIG. 18*

SINGLE CHIP POWER AMPLIFIER AND ENVELOPE MODULATOR

CROSS-REFERENCE TO RELATED APPLICATIONS

This application claims priority to, and hereby incorporates by reference, U.S. Provisional Application No. 60/527,321, entitled "One Chip Power Amplifier and Envelope Modulator," filed on Dec. 5, 2003, with the U.S. Patent and Trademark Office.

FIELD OF THE INVENTION

The present invention relates to radio frequency (RF) transceivers and, in particular, to RF power amplifiers and envelope modulators.

BACKGROUND OF THE INVENTION

Recent advances in wireless communication technology have enabled mobile terminals, such as cellular phones, personal digital assistants (PDA), and the like, to achieve greater signal quality and higher data transmission rates. These advances can be attributed, in part, to the complex data modulations schemes used in modern wireless communications circuits, such as GSM, EDGE, WCDMA, CDMA, IS-95, and so on. The modulation schemes typically produce a complex RF signal that is both phase modulated and amplitude modulated, generally referred to as non-constant envelope modulation. One way to realize/implement a transmitter for such a modulation scheme is to use polar modulation. An example of a polar modulation circuit may be found in published US application US20020077066 and published PCT application WO0237666, which are hereby incorporated by reference.

In polar modulation schemes such as the one described in US20020077066, a phase modulated RF signal having a constant amplitude is transmitted at varying power levels to realize the amplitude modulation. Varying the transmission power levels of the RF signal is performed by controlling a power amplifier in the mobile terminals. To maximize efficiency, the power amplifier is operated at or very near its highest available output level (i.e., in saturated mode), which is usually equal to the power supply level. The power supply is then varied to effect the amplitude modulation.

FIG. 1 illustrates the type of polar modulation circuit 100 described in US20020077066. As can be seen, the polar modulation circuit 100 includes a power amplifier 102 for amplifying an RF signal. The power amplifier 102 is configured to receive an RF input signal 104 and to output an RF output signal 106. Also present are a bias voltage 108 and a power supply 110 for providing power to the power amplifier 102. The power supply 110 is connected to the power amplifier 102 by an envelope controller 112 composed of transistors T1 and T2 and resistors Rg, R1, and R2, all connected as shown. The transistor T1 may be, for example, a bipolar junction transistor (BJT) and transistor T2 may be, for example, a metal-oxide semiconductor field-effect transistor (MOSFET). An amplitude modulation voltage 114 controls the envelope controller 112 to thereby modulate the power provided by the power supply 110 to the power amplifier 102.

SUMMARY OF THE INVENTION

The present invention is directed to a method and circuit for implementing an RF polar modulation circuit. The method and circuit of the present invention provide a self-compensated temperature stable envelope controller and self-compensated temperature stable power amplifier bias. Also included is an adaptive current-to-voltage modulation interface with pre-distortion compensation capability. AM/PM distortion are compensated for through envelope dependent power amplifier transistor biasing. Automatic compensation is provided for RF loads that are higher or lower than nominal loads. A method and circuit of the present invention also allows the polar modulation circuit to be implemented using low voltage MOS transistor processes.

In general, in one aspect, the invention is directed to a method of implementing a temperature stable radio frequency polar modulation circuit having a power amplifier and an amplitude modulator on a single chip. The method comprises inputting an envelope control current to the polar modulation circuit, reducing a temperature sensitivity of the envelope control current, converting the envelope control current to an envelope modulation voltage, and providing the envelope modulation voltage to an input of the amplitude modulator.

In general, in another aspect, the invention is directed to a single-chip radio frequency polar modulation circuit having an amplitude modulator and a power amplifier. The circuit comprises a current-to-voltage interface configured to receive an envelope control current, reduce a temperature sensitivity of the envelope control current, convert the envelope control current to an envelope modulation voltage, and provide the envelope modulation voltage to an input of the amplitude modulator, the current-to-voltage interface being substantially temperature insensitive. The circuit further comprises a resistive element in the current-to-voltage interface configured to adjust the envelope control current to compensate for distortion in the polar modulation circuit before the envelope control current is converted to an envelope modulation voltage.

It should be emphasized that the term comprises/comprising, when used in this specification, is taken to specify the presence of stated features, integers, steps, or components, but does not preclude the presence or addition of one or more other features, integers, steps, components, or groups thereof.

BRIEF DESCRIPTION OF THE DRAWINGS

The foregoing and other advantages of the invention will become apparent from the following detailed description and upon reference to the drawings, wherein:

FIGS. 16–17 illustrate graphs of the phase/gain characteristic of a polar modulation circuit with and without independent voltage supply to the power amplifier transistor stages; and FIG. 18 illustrates a polar modulation circuit having break-down voltage protection.

Figure 1:
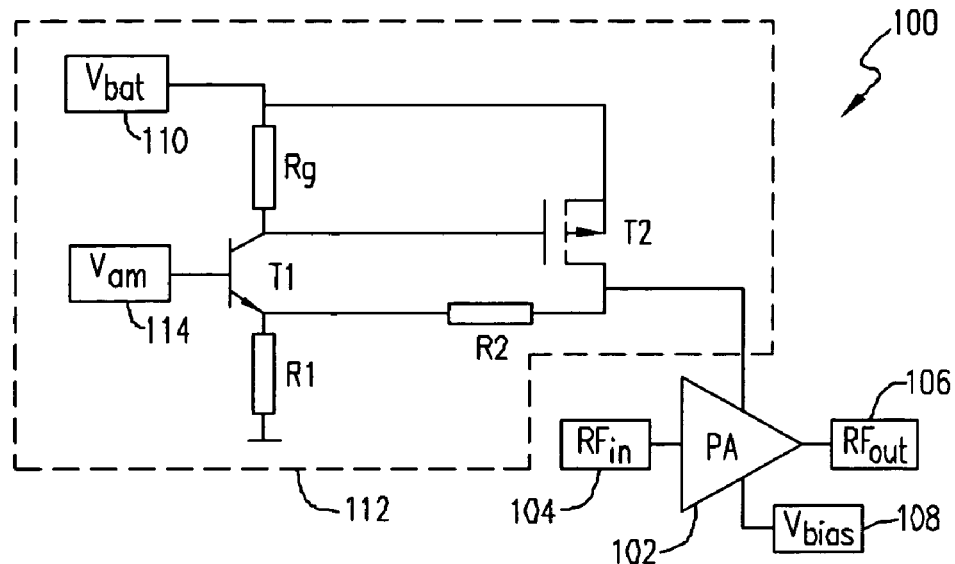
FIG. 1 illustrates a prior art polar modulation circuit.

DESCRIPTION OF ILLUSTRATIVE
EMBODIMENTS OF THE INVENTION

Following is a detailed description of illustrative embodiments of the invention with reference to the drawings wherein the same reference labels are used for the same or similar elements. It should be noted that the transistors shown in the drawings are intended to be general in nature and do not necessarily indicate a preference for a particular type of transistor. Likewise, the equations provided herein are intended to be general in nature and do not indicate a preference for a specific type of transistor. In addition, all resistors described herein may also be some other form of impedance such as capacitive (C), resistive (R), inductive (L), RC, RL, and the like. In general, the invention may be implemented with any suitable type of transistor (e.g., BJT, MOSFET, etc.), using any suitable resistive, capacitive, or inductive elements.

While the arrangement shown in FIG. 1 functions in principle, in practice there are several considerations that must be addressed. For example, the decreasing size of mobile terminals has forced circuit designers to combine as many components as possible onto a single chip in order to save space. However, having the envelope controller and the power amplifier on the same chip produces temperature gradients and thermal variations on the chip that are significantly worse than when the envelope controller is on a separate chip. These temperature gradients and thermal variations adversely affect the operation of the envelope controller and may cause it to become unstable.

Another consideration is how to make the envelope controller stable in a single-chip environment where very high electromagnetic fields and capacitive coupling are present on a conductive silicon substrate. Still another consideration is how to prevent ground or substrate leakage from distorting the envelope controller transfer function $AM_{out}/AM_{in}$. Other considerations include how to keep the lowest possible loop gain for the power amplifier, how to keep a well controlled starting point for the transfer function, how to bias the power amplifier to get the highest efficiency while maintaining a temperature stable bias without introducing AM/PM distortion (due to imperfections in the AM modulator), and how to implement the envelope controller with low-voltage complementary metal oxide semiconductors (CMOS) that are available in BiCMOS processes.

Various of the considerations that arise when an envelope controller and a power amplifier are on a single chip are addressed by at least some of the embodiments of the invention. In particular, in at least some embodiments of the invention, a single-chip polar envelope controller circuit that is stable relative to temperature variations is achieved.

As alluded to above, various embodiments of the invention provide a single-chip envelope controller circuit that is stable relative to temperature variations. Existing modulation circuits, such as the modulation circuit 100 shown in FIG. 1, tend to be unstable with temperature. Ideally, the amplitude modulation voltage 114 that is inputted to the envelope controller 112 will be the same or nearly the same as the supply voltage that is outputted from the envelope controller 112. In reality, however, this is difficult to achieve on a single chip because the field-effect transistor T2 used to regulate the power supply 110 dissipates a large amount of heat (e.g., up to 5 watts). The heat gives rise to temperature gradients on the chip as transistor T2 is switched on and off during operation of the envelope controller 112. The temperature gradients, in turn, may affect the operation of the BJT transistor T1 that functions as a difference amplifier in the envelope controller 112. Specifically, the base-emitter voltage $V_{be}$ of the BJT transistor T1 may vary with the temperature change (e.g., up to 2 mV/K). The base-emitter voltage $V_{be}$ may also vary with different collector currents in the bipolar transistor T1.

Figure 2:
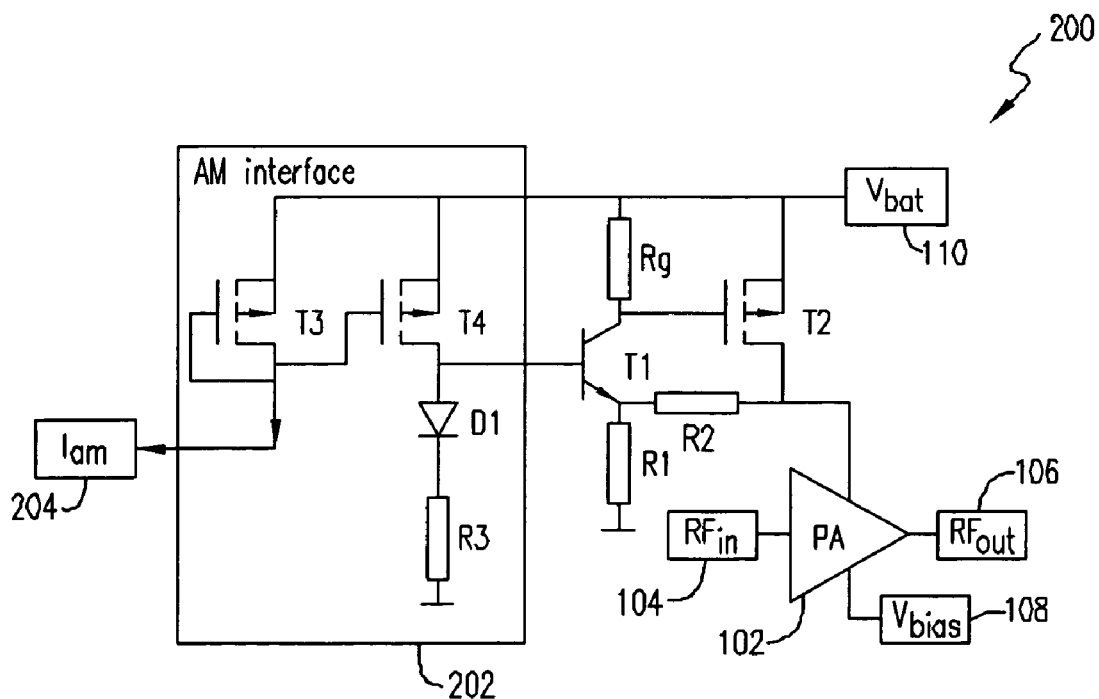
FIG. 2 illustrates a temperature stable polar modulation circuit.

Referring now to FIG. 2, in accordance with various embodiments of invention, it is possible to reduce or eliminate the temperature sensitivity of the modulation circuit 100 by using an envelope modulation current instead of the amplitude modulation voltage. As can be seen in FIG. 2, a modulation circuit 200 according to various embodiments of the invention is similar to the modulation circuit 100 in FIG. 1 except that it further has an amplitude current-to-voltage interface 202 and an envelope modulation current 204. The amplitude current-to-voltage interface 202 includes a current mirror composed of two field effect transistors T3 and T4, connected as shown. The sources of transistors T3 and T4 are connected to one another and to the power supply 110 (see FIG. 2). The gate of transistor T3 is shorted to its drain, which is in turn connected to the envelope modulation current $I_{am}$ 204 (or modulation reference value). The gate of transistor T4 is connected to the drain of transistor T3. The drain of transistor T4 is connected to a series combination of diode D1 and resistor R3 and also to the base of transistor T1.

In operation, the envelope modulation current 204 is mirrored from transistor T3 to transistor T4, and the current from transistor T4 is fed to diode D1 and resistor R3. The series combination of diode D1 and resistor R3 translate the current in transistor T4 into an envelope modulation voltage that is provided to the base of transistor T1. Since current mirrors have little or no temperature dependencies (a characteristic well-known to those having ordinary skill in the art), the voltage across diode D1 and resistor R3, and hence across transistor T1 and resistor R1, also do not have a temperature dependency. As a result, the modulation circuit 200 is much more temperature stable than existing solutions.

Note that, in some embodiments, resistors R1 and R3 are created using the same or a similar process such that they have similar electrical and temperature characteristics. Diode D1 is a transistor that is of the same kind and size as transistor T1 and has been connected as a diode.

Figure 3:
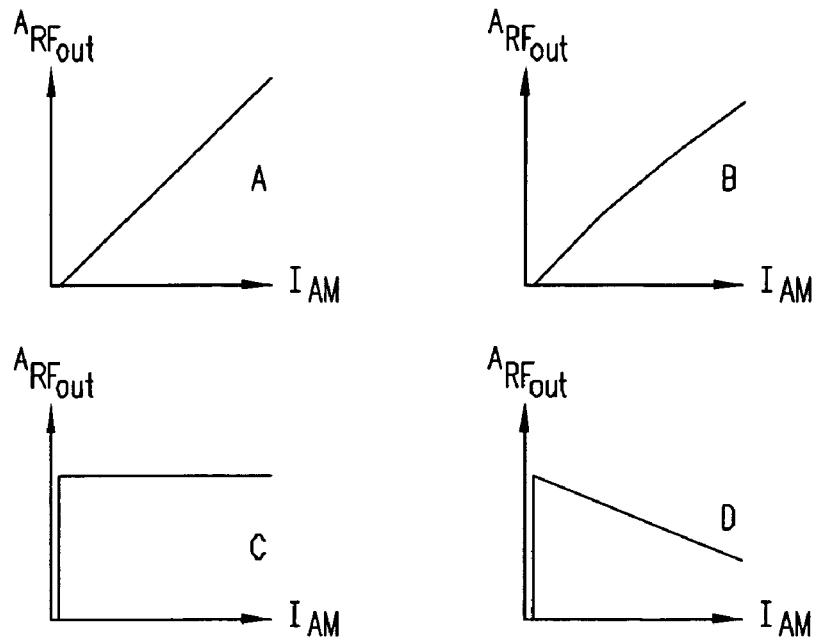
FIG. 3 illustrates transfer function graphs for prior art polar modulation circuits with low loop gain.

A result of the above arrangement is that the current-to-voltage interface 202 has a very low loop gain. A low loop gain, unfortunately, introduces distortion in the modulation circuit 200. This is illustrated in graphs A–D of FIG. 3, where the vertical axes represent the amplitude of the output RF signal 106 and the horizontal axes represent the envelope modulation current 204. Graphs A and B represent the transfer function for the modulation circuit 200 in an ideal and an actual case, respectively, while graphs C and D represent the gain for the modulation circuit 200 in the ideal and actual case, respectively. As can be seen in graph D, the gain of the modulation circuit 200 in the actual case is far from ideal and resembles more of a square root function. This is partly caused by the low loop gain, which causes the RF output signal not to track the envelope control current. It is also partly caused by the performance of the power amplifier such that there will be some distortion even if the loop gain is infinite.

Figure 4:
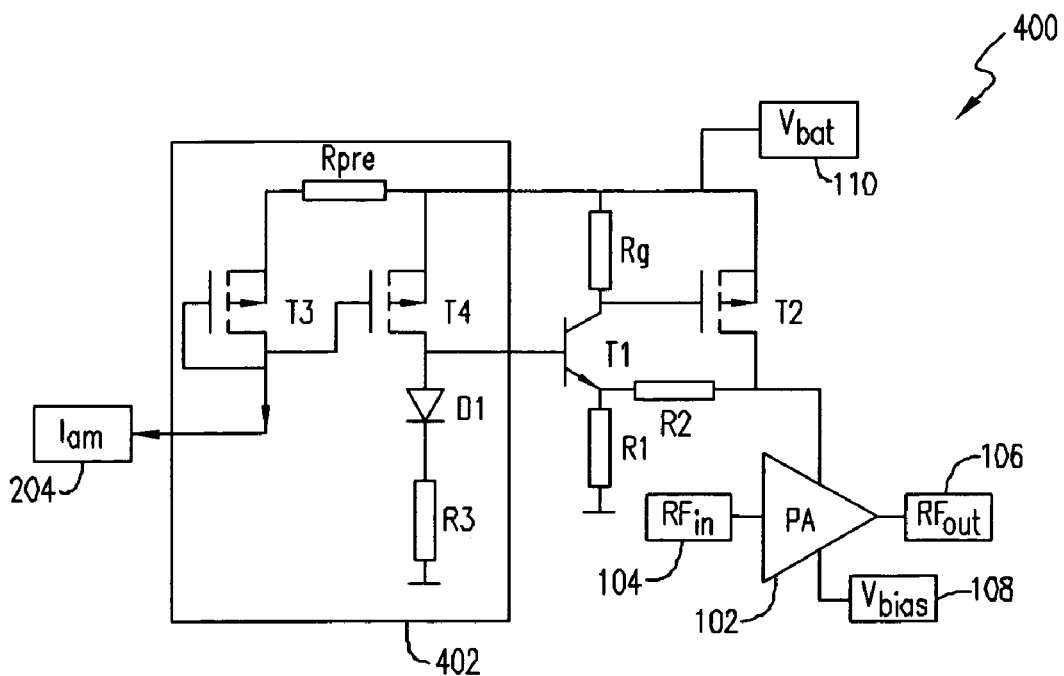
FIG. 4 illustrates a polar modulation circuit capable of compensating for distortion due to low loop gain.

In accordance with various embodiments of the invention, the distortion may be addressed by partly squaring the envelope modulation voltage being input to the envelope controller. Referring now to FIG. 4, an exemplary modulation circuit 400 implementing such a function is shown. The modulation circuit 400 includes a current-to-voltage interface 402 that is similar to the current-to-voltage interface 202 of FIG. 2, except that it has a resistor $R_{pre}$ connected between the two drains of transistors T3 and T4. The resistor $R_{pre}$ functions to partly square the envelope modulation voltage, making the transfer function in graph B look more like the transfer function in graph A. The size of resistor $R_{pre}$ may be selected as needed depending on the particular application.

Figure 5:
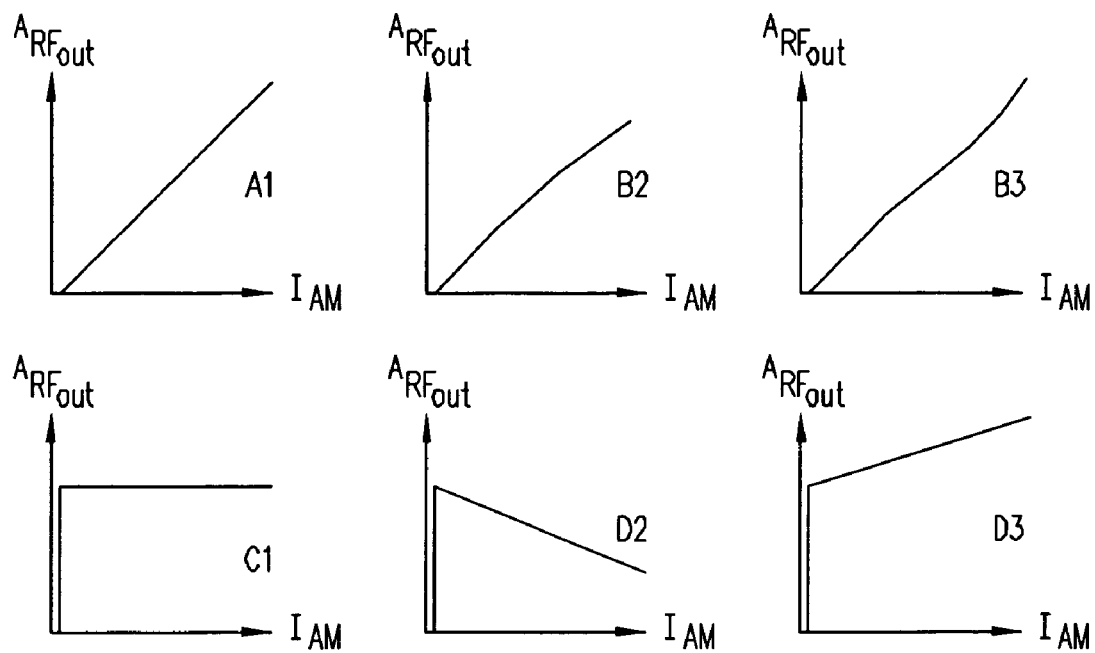
FIG. 5 illustrates transfer function graphs for prior art polar modulation circuits with non-nominal RF loads.

The transfer function also changes when the RF load changes at the output of the modulation circuit, which affects the VSWR (voltage standing wave ratio) for the circuit. This is illustrated in FIG. 5, graphs A1–D3, where the vertical and horizontal axes again represent the amplitude of the output RF signal 106 and the envelope modulation current 204, respectively, for the modulation circuit 400. Chart A1 represents the transfer function for the modulation circuit 400 in an ideal case when the RF load is nominal, graph B2 represents the transfer function when the RF load is below nominal, while graph B3 represents the transfer function when the RF load is greater than nominal. Charts C1, D2, and D3 represent the gain corresponding to graphs A1, B2, and B3, respectively. As can be seen in graphs D2 and D3, the gain of the modulation circuit 400 is far from ideal when the RF load is not a nominal load.

Figure 6:
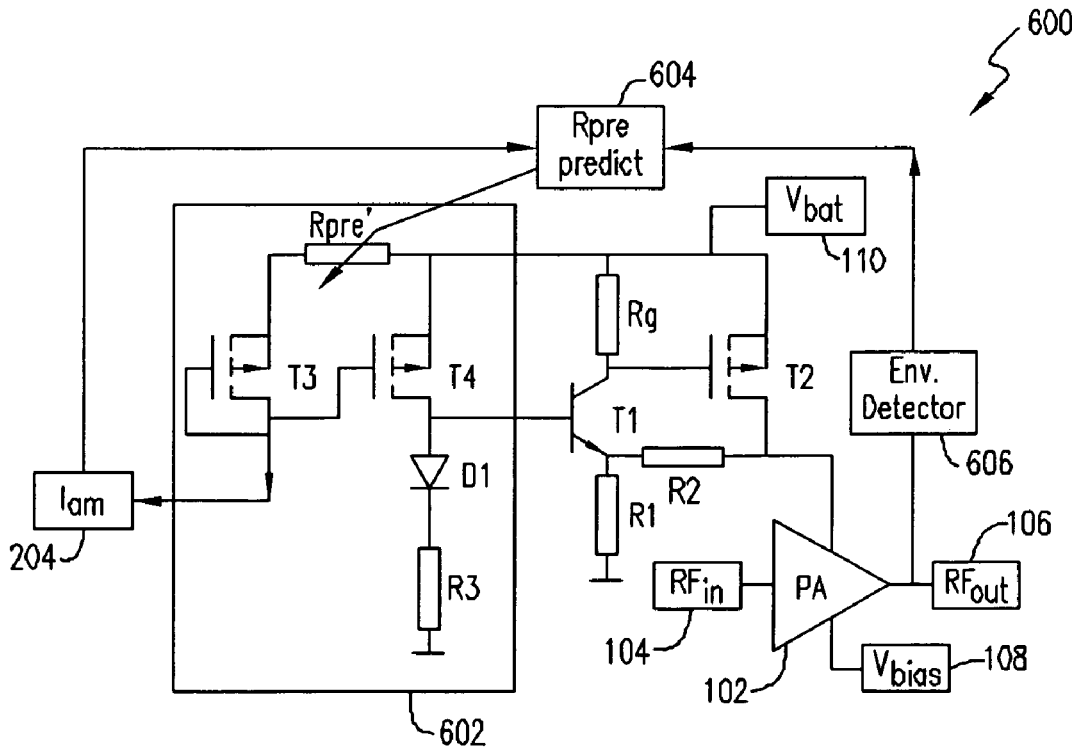
FIG. 6 illustrates a polar modulation circuit capable of compensating for non-nominal RF loads.

In accordance with various embodiments of the invention, the gain of the modulation circuit 400 may be corrected for a non-nominal RF load (hence, non-ideal VSWR) by detecting the RF load (or the slope variation in the gain) and adaptively changing $R_{pre}$ accordingly. Referring now to FIG. 6, an exemplary modulation circuit 600 implementing an adjustable resistor $R_{pre}$ is shown. The modulation circuit 600 includes a current-to-voltage interface 602 that is similar to the current-to-voltage interface 402 of FIG. 4, except that it has an adjustable resistor $R_{pre}'$ connected between the drains of transistors T3 and T4. The modulation circuit 600 further includes an $R_{pre}$ predictor 604 that is configured to predict the value of the adjustable resistor $R_{pre}'$, and an envelope detector 606 that is configured to measure the amplitude of the RF output signal 106. This amplitude information is then provided to the $R_{pre}$ predictor 604 along with the envelope modulation current 204. The $R_{pre}$ predictor 604 measures the value of the envelope modulation current 204 and compares this value with the amplitude of the RF output signal 106.

Figure 7:
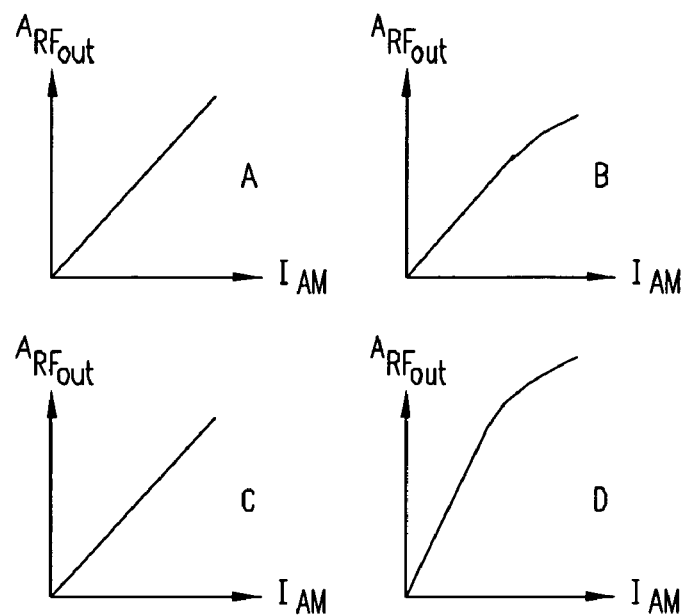
FIG. 7 illustrates transfer function graphs for prior art polar modulation circuits with low ohmic RF loads.

Based on this comparison, the $R_{pre}$ predictor 604 adjusts the resistance of adjustable resistor $R_{pre}'$ to minimize any deviations in the gain variations from $I_{am}$ to the amplitude of the RF output signal 106.

Where the RF load is a high ohmic load (assuming no isolator), the output power of the power amplifier 102 will be less than under nominal load conditions. The output current of the power amplifier 102 will also be less. On the other hand, where the RF load is a low ohmic load, the power amplifier 102 may output its maximum power output (i.e., saturated), as determined by the biasing setting. For more information regarding this phenomenon, the reader is referred to U.S. Provisional Application Nos. 60/388172 and 60/400561, which are incorporated herein by reference. This is illustrated in FIG. 7, graphs A–D, where the vertical axes again represent the amplitude of the output RF signal 106 and the horizontal axes represent the envelope modulation current 204 for the modulation circuit 600. Charts A and B represent the transfer function for the modulation circuit 600 in a nominal load (ideal) case and a low ohmic load case, respectively. Charts C and D represent the power output of the power amplifier 102 for the nominal load and low ohmic load case, respectively. As can be seen in graph D, the power (and current) output of the power amplifier 102 increases much faster than in the nominal case, which may result in distortion of the RF output signal.

Figure 8:
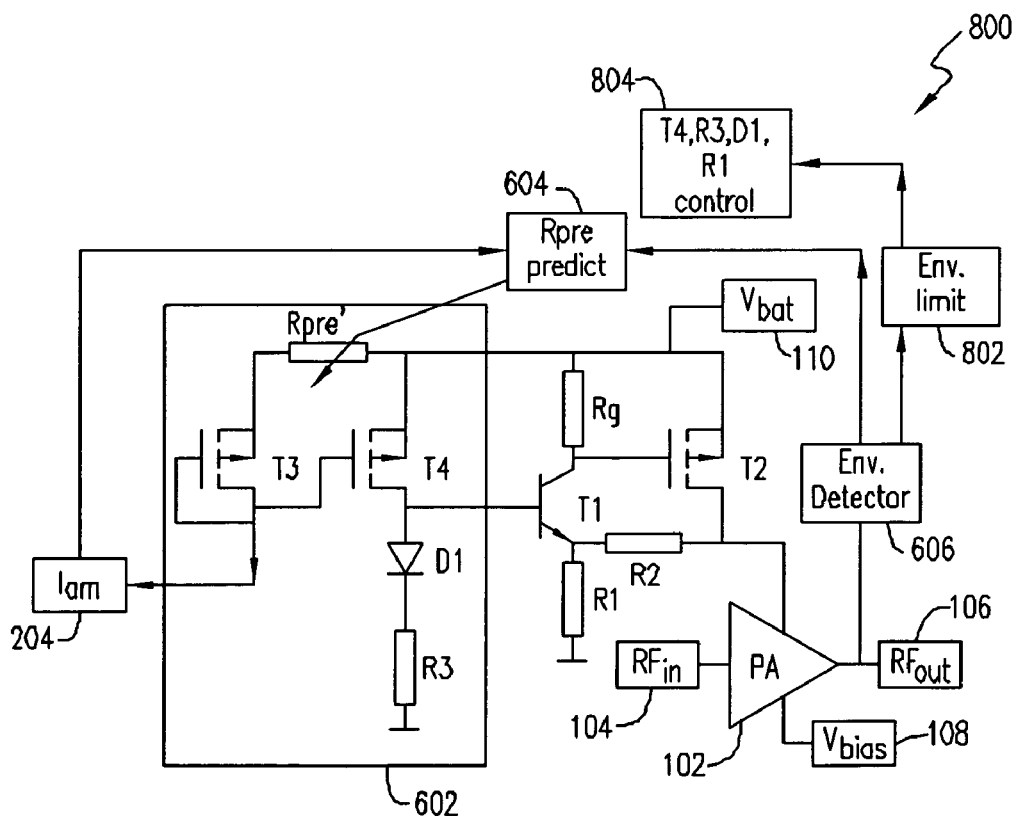
FIG. 8 illustrates a polar modulation circuit capable of compensating for low ohmic RF loads.

In accordance with various embodiments of the invention, the power output of the modulation circuit 600 may be corrected (i.e., VSWR compensation) by detecting the amplitude of the RF output signal and limiting the output of the power amplifier 102 accordingly. Referring now to FIG. 8, an exemplary modulation circuit 800 implementing a power limiting function is shown. The modulation circuit 800 is similar to the modulation circuit 600 of FIG. 6, except that the envelope detector 606 is further connected to an envelope limiter 802. The envelope limiter 802 provides amplitude information to a component controller 804 connected either transistor T4, resistor R3, diode D1, or resistor R1. One or more of the transistor T4, resistor R3, diode D1, and resistor R1 may then be used to control the slope of the envelope modulation voltage so that the maximum value of the envelope modulation voltage at nominal load will not result in a saturated modulator when there is a load mismatch.

In some embodiments, the envelope limiter 802 and the component controller 804 may be implemented as a digital function (i.e., switched in or out in parallel or in series) or an analog automatic gain adjustment control (i.e., an analog control-loop) similar to the one described in Power Amplifier Protection, and Power Control with Increased VSWR Handling, mentioned above. It is also possible to implement the power limiting function without a separate envelope limiter 802, in which case the envelope detector 606 may be configured to provide the amplitude information to the component controller 804.

Figure 9:
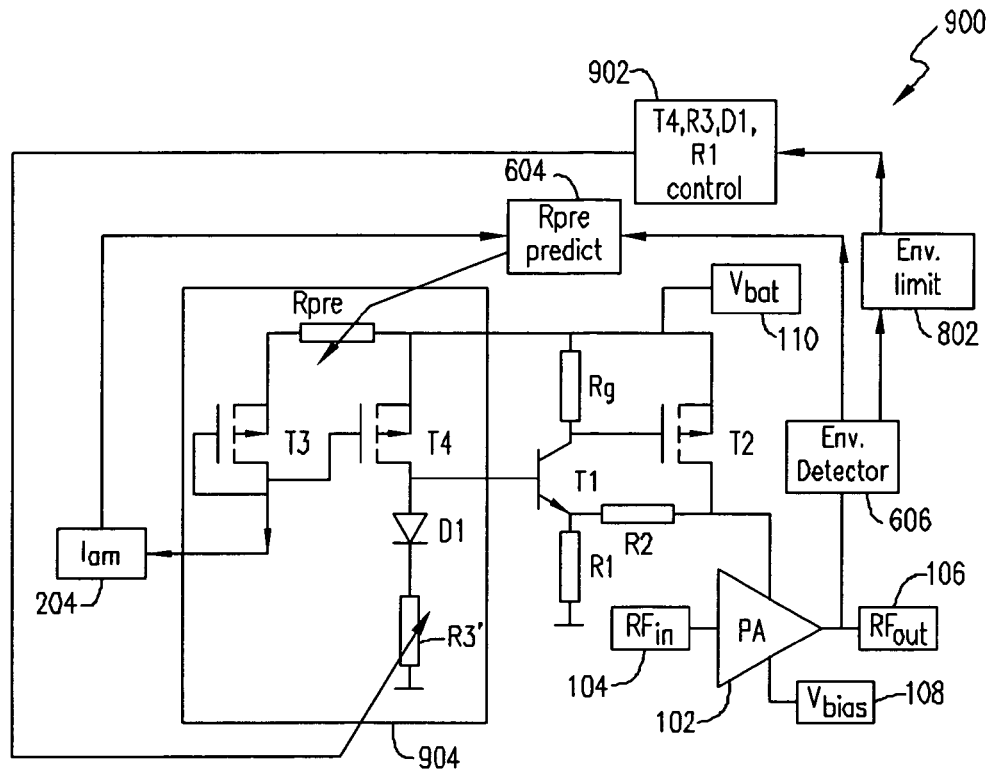
FIG. 9 illustrates a specific implementation of the polar modulation circuit shown in FIG. 8.

FIG. 9 illustrates an exemplary implementation of the modulation circuit shown in FIG. 8. As can be seen in FIG. 9, one way to avoid modulation distortion, high output power, high power consumption, and high currents is to lower the value of resistor R3 when the amplitude of the RF output signal reaches a preset value. Thus, in these embodiments, the component controller 902 is connected to an adjustable resistor R3' in the current-to-voltage interface 904. The component controller 902 controls the size of the adjustable resistor R3' to thereby limit the power output of the power amplifier 102.

In the embodiments described thus far, the power amplifier transistors (internal to the power amplifier) have a small region of collector voltage where they are not able to conduct current (saturation)). This prevents the transfer function of the modulation circuit from starting at an envelope modulation current of 0 μA. Examples are shown on the horizontal axes of FIG. 3 (though not in the illustrative graphs of FIG. 7). The transfer function instead starts at an envelope modulation current that corresponds to a collector voltage at the power amplifier, which is close to the saturation voltage in the transistors. In existing solutions, this offset is calibrated and compensated for with an offset current on the envelope modulation current using a separate, externally implemented compensation circuit.

Figure 10:
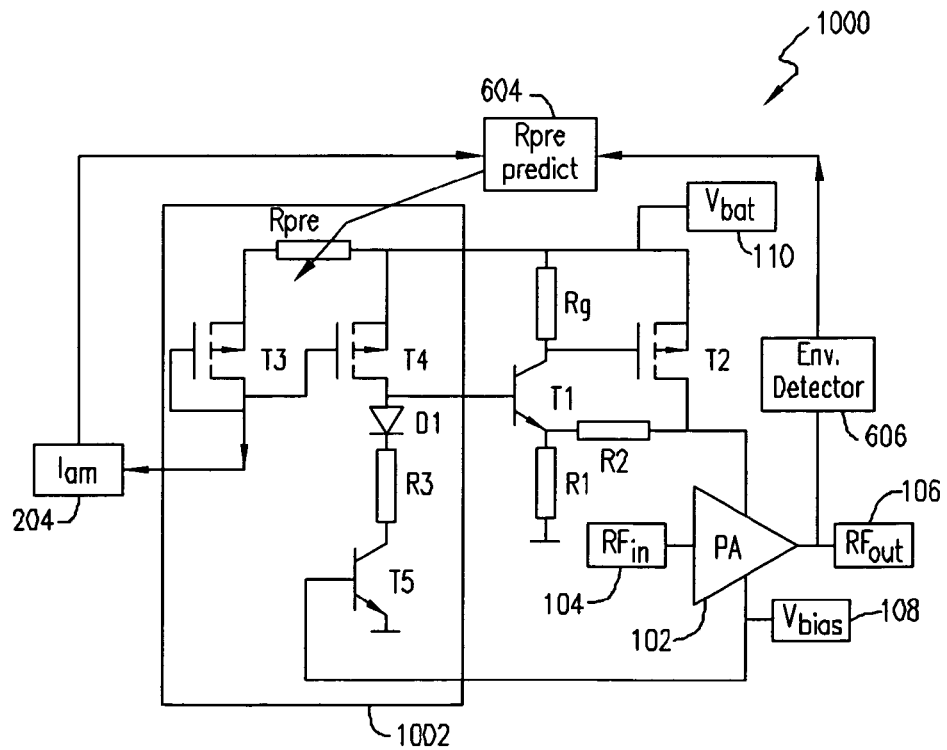
FIG. 10 illustrates a polar modulation circuit having offset compensation.

In accordance with various embodiments of the invention, the offset compensation may be implemented as part of the modulation circuit itself, since the envelope controller and the power amplifier circuit are on a single chip. Such an arrangement has the advantage of requiring less production trimming than a compensation circuit that is separate from the modulation circuit. In one embodiment, the offset compensation is implemented as an additional transistor having the same saturation voltage as the power amplifier in the current-to-voltage interface, shown in FIG. 10. As can be seen, the modulation circuit 1000 has a current-to-voltage interface 1002 that is similar to the current-to-voltage interface 602 (see FIG. 6), except that it includes an offset compensation transistor T5. The offset compensation transistor T5 may be a bipolar junction transistors with a collector connected to resistor R3 and a base connected to the bias voltage 108. Such an arrangement introduces an offset voltage that offsets the saturation voltage in the power amplifier transistors. Preferably, transistor T5 is selected so as to be similar to the transistors in the power amplifier.

Figure 11:
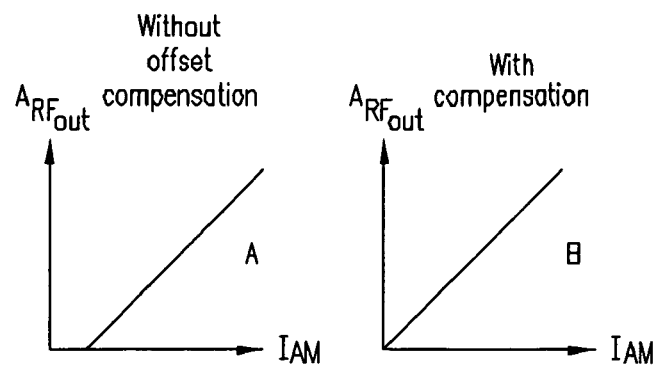
FIG. 11 illustrates transfer function graphs for a polar modulation circuit with and without offset compensation.

FIG. 11, graphs A and B, illustrate the difference in the transfer function starting points of the modulation circuit 1000 before and after inserting the offset compensation transistor T5 in the current-to-voltage interface 1002, respectively. As can be seen in graph B, the transfer function starting point of the modulation circuit 1000 after inserting the offset compensation transistor T5 has effectively been shifted to nearly 0 μA.

A polar modulation circuit's biasing circuit may be implemented as a voltage source connected via an inductor with 0 ohm resistance to the separate transistor stages in the power amplifier. There are, however, other aspects of biasing the power amplifier that also need to be considered, such as temperature stability, efficiency, and symmetry. In bipolar power amplifiers, the bipolar junction transistors are not temperature stable by themselves, as opposed to many field effect power amplifiers. It is possible to make the bipolar junction transistors temperature stable by adding emitter resistance to ground, but this lowers the efficiency of the power amplifiers. Also, the biasing voltage (base voltage to the transistors) will change depending on the RF input power to each stage, which will introduce AM/PM distortion into the power amplifier.

Figure 12:
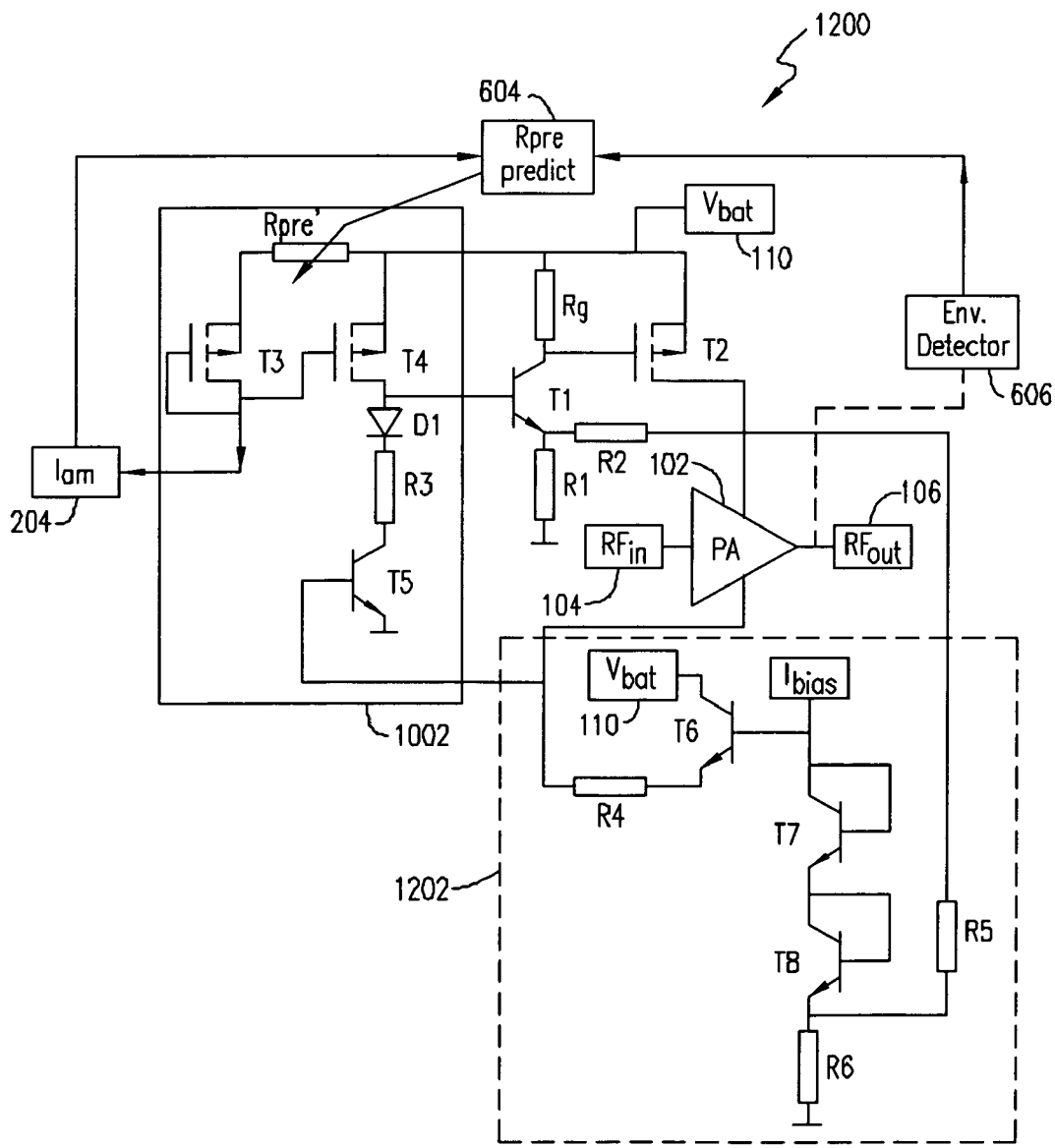
FIG. 12 illustrates an envelope dependent bias supply.

In accordance with various embodiments of the invention, a current-driven biasing input may be used instead of a voltage-driven biasing input for the power amplifier. FIG. 12 illustrates an exemplary implementation of a current-driven biasing input for a modulation circuit 1200. As can be seen, the modulation circuit 1200 is similar to the modulation circuit 1000 (see FIG. 10), except that the biasing voltage 108 has been replaced with a current-driven biasing network 1202, and the connection from the power amplifier 102 to the envelope detector 606 has been made optional (dashed line), indicating that it is not necessary to connect the envelope detector 606 to the output of the power amplifier 102, and that other variables may be correlated to the envelope and used instead. The current-driven biasing current network 1202 is composed of transistors T6–T8 and R4–R6, all connected as shown. A current $I_{bias}$ is then converted to a voltage through transistors T7, T8 and R6. The bias input of the power amplifier 102 consumes current from rectified RF signal on the base terminals of the power amplifier's internal transistors, where T6 & T7 form a current mirror, and T7, T8, and R6 provide current-to-voltage conversion. The bias current $I_{bias}$ is proportional to the RF envelope, which is close to being proportional to the collector voltage supplied to the power amplifier.

Resistor R4, which is dimensioned for temperature stability reasons, is configured to prevent the power amplifier 102 from having a constant bias voltage. By adding part of the collector voltage supplied by the envelope controller to the power amplifier 102, it is possible to compensate for the voltage drop across R4 by inserting resistor R5 between the emitter of transistor T8 and resistor R2. Stated another way, at high output power levels the power amplifier will consume higher currents through R4 than at lower output powers. This means that at higher output power, there will be a voltage drop across R4 leading to a lowered input current in the power amplifier and preventing the power amplifier from staying in compression. R5 feeds the biasing circuit with a voltage proportional to the collector voltage, which compensates for the voltage drop across R4. In various embodiments, the resistor R4 may be connected to either the base terminals of the power amplifier if the power amplifier transistors are bipolar junction transistors, or to the gate terminals if the power amplifier transistors are field-effect transistors.

Figure 13:
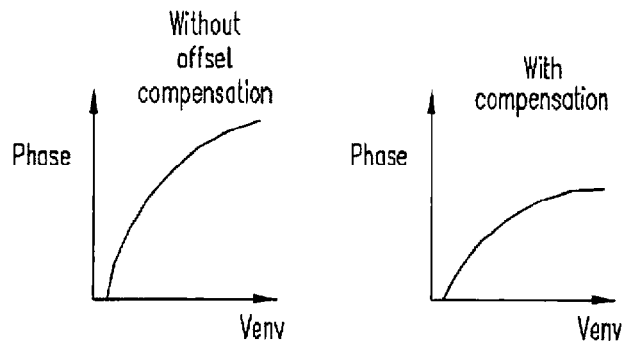
FIG. 13 illustrates the AM/PM behavior of a modulation circuit with and without the envelope-dependent bias supply.

Moreover, the biasing current circuit 1202 of FIG. 12 may further be used to linearize the AM to PM behavior of the power amplifier 102. For example, it is possible to decrease in the first order term of the AM to PM distortion ($I_{am}$ to phase of $P_{out}$) using this circuit. Recall that the AM/PM performance depends on the biasing of the power amplifier. By controlling the biasing, the AM/PM distortion can be lowered. Indeed, this is one of the advantages of having an envelope-dependent bias supply to the power amplifier 102. Graphs A and B of FIG. 13 illustrate the AM/PM behavior of the modulation circuit 1200 with and without an envelope-dependent bias supply to the power amplifier 102, respectively. As can be seen, the AM/PM distortion in graph B has been decreased to about half of that in graph A.

Figure 14:
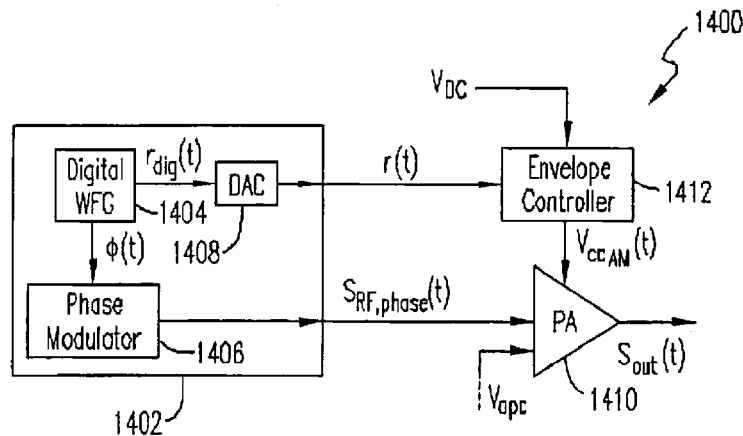
FIG. 14 illustrates a prior art polar modulation circuit in block diagram form.

The AM/PM distortion may be further improved by providing a separate power supply to the various transistor stages within the power amplifier itself. Referring now to FIG. 14, a block diagram of a typical polar modulation circuit 1400 is shown. The polar modulation circuit 1400 has a control block 1402 that includes a digital waveform generator 1404, a phase modulator 1406 and a digital to analog converter 1408. The function of these components are well-known to those having ordinary skill in the art and will not be described here. The control block 1402 provides a constant envelope, phase modulated signal $S_{RF,phase}(t)$ to a power amplifier 1410 and an envelope control signal r(t) to an envelope controller 1412. The output of the power amplifier 1410 is a signal $S_{out}(t)$ having both phase and amplitude modulation. The amplitude power control signal, $V_{apc}$, is normally constant, but has been introduced as a time dependent signal here in order to minimize AM/PM distortion. It may be used not only to compensate for the voltage drop in the resistor R4, but also to select a point where optimum performance of the power amplifier is obtained.

The envelope control signal r(t), which is the general form for $I_{am}$, causes the envelope controller 1412 to vary/modulate the power supply VDC (e.g., the battery in a handheld mobile terminal). This results in a modulated voltage supply VccAM(t) to the power amplifier 1410. The modulated voltage supply may be written as a function of the envelope control signal r(t) and the power supply $V_{DC}$, VccAM(t)= f{r(t), $V_{DC}$}. Due to the modulation process, the signal $S_{RF,phase}(t)$ goes from having a constant envelope at the input of the power amplifier 1410 to having a non-constant envelope at the output of the power amplifier. From the foregoing, it can be seen that achieving a low AM/PM distortion for a polar modulation transmitter requires that (1) VccAM(t) accurately track r(t); (2) the envelope of the $S_{out}(t)$ signal accurately track VccAM(t); and (3) changes in VccAM(t) have small (negligible) effect on the phase shift of $S_{out}(t)$ through the power amplifier.

Figure 15:
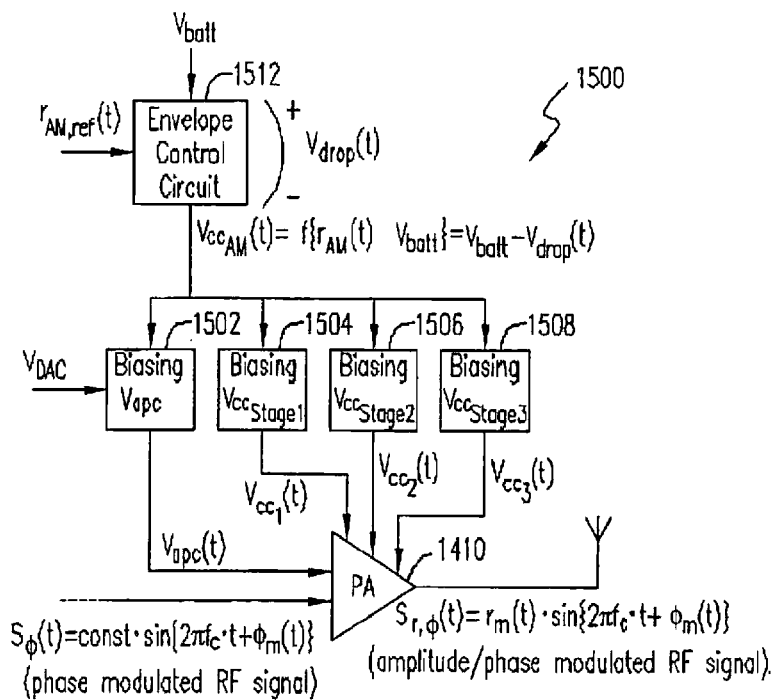
FIG. 15 illustrates a polar modulation circuit having independent voltage supply to the power amplifier transistor stages.

Item (1) may be addressed as described in FIGS. 2–17 above. In accordance with various embodiments of the invention, items (2) and (3) may be addressed by providing each of the amplifier stages in the power amplifier 1410 with its own VccAM signal. In particular, the modulation present at the VccAM node may be routed through biasing networks to provide an optimal $V_{cc}$ signal to each of the amplifier stages, as shown in FIG. 15. As can be seen, the modulation circuit 1500 includes the power amplifier 1410 and the envelope control circuit 1512 mentioned previously (the control block 1402 has been omitted here). Also present is a biasing network 1502 similar to one described previously with respect to FIGS. 12–13, where $V_{DAC}$ is used to set $I_{bias}$. In addition, separate biasing networks 1504–1508 are provided, each supplying a separate $V_{cc}$ signal ($V_{CC1}$, $V_{CC2}$, $V_{CC3}$) for biasing the transistor stages of the power amplifier 1410. The biasing networks 1504–1508 are provided with a supply voltage from the envelope control circuit 1512, VccAM(t)=f{r(t), $V_{DC}$}=$V_{batt}$−$V_{drop}(t)$. To find the optimal relationship between the $V_{ccx}$ signal and a certain amplifier stage, the overall amplifier/envelope controller performance may be considered, both in terms of phase distortion (AM/PM) and gain distortion (AM/AM).

The above arrangement allows the amplifier/envelope controller configuration to be tailored for the actual communication standard (EDGE, WCDMA, GSM, etc.), and also facilitates tradeoff between AM/AM performance and AM/PM performance. For example, assume that it is desirable to design a circuit with large modulation depth and high linearity requirements on AM/PM and AM/AM. Now assume that $V_{apc}$ is independent of the output power level (and of $V_{CCAM}$) and all power amplifier stages are connected to the same voltage node. Such a power amplifier arrangement will have a phase or gain characteristic similar to the graph shown in FIG. 16.

If instead, $V_{apc}$ is made dependent on $V_{CCAM}$ and/or a separate $V_{CC}$ voltage is used for the different power amplifier stages, a phase or gain characteristic similar to the graph shown in FIG. 17 will result. In that case, the phase slope (degrees/dB) is much smaller than that of FIG. 16, at least in the output power range in which the modulation is expected. Thus, by using the modulation circuit topology shown in FIG. 15, the linearity in the relationship between the envelope of the RF signal, $S_{out}(t)$, and the reference signal, r(t), is improved. Further, variations in the phase $\Phi$ of the RF signal $S_{out}(t)$ due to modulation of the envelope of the signal is reduced.

Note that the example shown in FIG. 15 is provided for illustrative purposes only and those having ordinary skill in the art will recognize that variations and modifications are possible. It is, for example, not necessary to individually modulate each power amplifier stage. Instead, the same Vcc signal may be used for stage 2 and stage 3 (Vcc2(t)=Vcc3(t)) and a separate Vcc line (Vcc1) used for the first stage. Another possibility, for example, is to only modulate some of the stages and connect the rest of the stages to Vbat (either directly or, for example, via some kind of voltage divider) or some other constant-voltage source(s). Moreover, the complexity of the different biasing networks 1502–1508 may vary. For example, the networks may be composed of passive or active circuits, could be frequency-dependent or frequency-independent, could be linear or non-linear, or any combination of the above.

To implement a polar modulation circuit using low voltage BiCMOS technology, it is necessary to guard against having too low a break-down voltage. In many BiCMOS processes, the short channel PMOS transistors have too low a break-down voltage (i.e., lower than $V_{bat}$). Referring now to FIG. 18, a modulation circuit 1800 is shown that overcomes the break-down voltage problem according to various embodiments of the invention. The modulation circuit 1800 includes a transistor T9 together with the diodes D3 and D4 and a current source $I_1$, all connected as shown. Transistor T9 and diodes D3 and D4 protect the regulator transistor T2 when the supply voltage exceeds 3 diode voltage drops minus the pinch-off voltage of T9 while the envelope controller is in operating mode. Thus, for example, in a battery having a maximum voltage of 4.4 V, the three diode voltage drops minus the pinch-off voltage of T9 amount to 3(0.9 V)−(0.5 V)=2.2 V, making it possible to use, for example, 2.2 V PMOS transistors.

Transistor T2 is also protected by transistor T9 when the current source $I_1$ is turned off by the diodes D4. The control circuit, D3, D4, T9 and $I_1$, should not consume any current when the modulation circuit is in the off state, but the PMOS transistors T2 and T9 should still be protected from voltage higher than the breakdown voltage of each PMOS.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A method of implementing a radio frequency polar modulation circuit having a self-compensated temperature-stable power amplifier and a self-compensated temperature-stable envelope controller on a single chip, the method comprising the steps of:

providing an envelope modulation current to the polar modulation circuit to compensate for temperature offsets;

converting the envelope modulation current to an envelope modulation voltage;

providing the envelope modulation voltage to the envelope controller;

modulating a power supply of the power amplifier using the envelope controller; and limiting a maximum output power of the power amplifier to less than or equal to a predetermined value for a given envelope modulation current.

2. The method according to claim 1, wherein the step of limiting a maximum output power of the power amplifier is performed using a biasing network connected to the power amplifier, the maximum output power of the power amplifier is set by a biasing current provided to the biasing network and an output impedance of the biasing network.

3. The method according to claim 2, wherein the power amplifier comprises bipolar junction transistors, the biasing network connected to the power amplifier by a resistive element connected to the base terminals of the bipolar junction transistors.

4. The method according to claim 2, wherein the power amplifier comprises field effect transistors, the biasing network connected to the power amplifier by a resistive element connected to the gate terminals of the field effect transistors.

5. The method according to claim 1 wherein the step of converting the envelope modulation current to an envelope modulation voltage comprises inputting the envelope modulation current into a current mirror.

6. The method according to claim 5, further comprising adjusting the envelope modulation voltage provided to the input of the envelope controller to compensate for distortion due to power amplifier performance by connecting a resistive element between the supply voltage terminals of the current mirror.

7. The method according to claim 6, wherein the resistive element is selected so as to minimize a voltage drop between a supply voltage of the current mirror and the input of the envelope controller.

8. The method according to claim 7, further comprising adjusting the envelope modulation voltage of the envelope controller to compensate for distortion due to load variation by adaptively changing a value of the resistive element connected between the supply voltage terminals of the current mirror based on the envelope modulation current and an output signal amplitude of the power amplifier.

9. The method according to claim 5, wherein the step of limiting a maximum output power of the power amplifier comprises detecting when an output signal amplitude of the power amplifier has exceeded a threshold voltage and adaptively changing a value of one or more preselected components of the polar modulation circuit until the output signal amplitude no longer exceeds the threshold voltage.

10. The method according to claim 9, wherein the one or more preselected components include a resistive element in the current mirror connecting the current mirror to ground.

11. The method according to claim 5, further comprising compensating for an offset in the envelope modulation current by providing a transistor in the current mirror that has the same saturation voltage as the power amplifier.

12. The method according to claim 1, further comprising biasing the power amplifier by providing a biasing current having a value that is dependent on an output signal amplitude of the envelope controller and using a biasing network to convert the biasing current to a biasing voltage to compensate for thermal offset.

13. The method according to claim 1, further comprising: providing a separate supply voltage to each transistor stage of the power amplifier; and wherein each separate supply voltage has been optimized for its respective transistor stage.

14. The method according to claim 13, wherein two or more transistor stages of the power amplifier share the same supply voltage.

15. The method according to claim 1, further comprising protecting a regulator transistor of the envelope controller when its supply voltage exceeds a predetermined amount by providing a protective transistor between the regulator transistor and the power amplifier, the protective transistor biased by a diode network and a current source such that the envelope controller consumes essentially zero current when in an off state to allow the polar modulation circuit to be implemented using low voltage transistors.

16. A single-chip radio frequency polar modulation circuit having a self-compensated temperature-stable envelope controller and a self-compensated temperature-stable power amplifier, the circuit comprising: a current-to-voltage interface configured to receive an envelope modulation current, convert the envelope modulation current to an envelope modulation voltage, and provide the envelope modulation voltage to an input of the envelope controller, the current-to-voltage interface being substantially temperature insensitive; and means for limiting a maximum output power of the power amplifier to less than or equal to a predetermined value for a given envelope modulation current.

17. The polar modulation circuit according to claim 16, wherein the means for limiting a maximum output power of the power amplifier includes a biasing network connected to the power amplifier, the maximum output power of the power amplifier is set by a biasing current provided to the biasing network and an output impedance of the biasing network.

18. The polar modulation circuit according to claim 17, wherein the power amplifier comprises bipolar junction transistors, the biasing network connected to the power amplifier by a resistive element connected to the base terminals of the bipolar junction transistors.

19. The polar modulation circuit according to claim 17, wherein the power amplifier comprises field effect transistors, the biasing network connected to the power amplifier by a resistive element connected to the gate terminals of the field effect transistors.

20. The polar modulation circuit according to claim 16, wherein the current-to-voltage interface includes a current mirror and the envelope modulation current is converted to an envelope modulation voltage by inputting the envelope modulation current into the current mirror.

21. The polar modulation circuit according to claim 20, wherein the current-to-voltage interface further includes a resistive element connected between the supply voltage terminals of the current mirror, the resistive element configured to adjust the envelope modulation voltage to compensate for distortion due to power amplifier performance.

22. The polar modulation circuit according to claim 21, wherein the resistive element is selected so as to minimize a voltage drop between a supply voltage of the current mirror and the input of the envelope controller.

23. The polar modulation circuit according to claim 22, further comprising: an envelope detector for measuring an output signal amplitude of the power amplifier; and a predictor for adaptively changing a value of the resistive element connected between the supply voltage terminals of the current mirror based on the envelope modulation current and the output signal amplitude of the power amplifier to compensate for distortion due to load variation.

24. The polar modulation circuit according to claim 23. wherein the means for limiting a maximum output power of the power amplifier comprises: an envelope limiter for detecting when the output signal amplitude of the power amplifier has exceeded a threshold voltage; and a controller for adaptively changing a value of one or more preselected components of the polar modulation circuit until the output signal amplitude no longer exceeds the threshold voltage.

25. The polar modulation circuit according to claim 24, wherein the one or more preselected components include a resistive element in the current mirror connecting the current mirror to ground.

26. The polar modulation circuit according to claim 20, further comprising a transistor in the current mirror connecting the current mirror to ground that has the same saturation voltage as the power amplifier for compensating an offset in the envelope modulation current.

27. The polar modulation circuit according to claim 16, further comprising a biasing network configured to convert a biasing current having a value that is dependent on an output signal amplitude of the envelope controller to a biasing voltage and provide the biasing voltage to the power amplifier to compensate for thermal offset.

28. The polar modulation circuit according to claim 16, further comprising a separate supply voltage providing a biasing voltage to each transistor stage of the power amplifier; and wherein each separate supply voltage has been optimized for its respective transistor stage.

29. The polar modulation circuit according to claim 28, wherein two or more transistor stages of the power amplifier share the same supply voltage.

30. The polar modulation circuit according to claim 16, further comprising a protective transistor connected between a regulator transistor of the envelope controller and the power amplifier for protecting the regulator transistor when a supply voltage thereof exceeds a predetermined amount, the protective transistor biased by a diode network and a current source such that the envelope controller consumes essentially zero current when in an off state to allow the polar modulation circuit to be implemented using low voltage transistors.

* * * * *

UNITED STATES PATENT AND TRADEMARK OFFICE
CERTIFICATE OF CORRECTION

PATENT NO.         : 7,145,385 B2
APPLICATION NO.    : 10/869987
DATED              : December 5, 2006
INVENTOR(S)        : Brandt et al.

It is certified that error appears in the above-identified patent and that said Letters Patent is hereby corrected as shown below:

Title Page, in Field (56), under "U.S. PATENT DOCUMENTS", in Column 1, Line 1, delete "Budnik" and insert -- Budnik et al. --, therefor.

Title Page, in Field (56), under "U.S. PATENT DOCUMENTS", in Column 2, Line 3, delete "2003/0008845 A1" and insert -- 2003/006845 A1 --, therefor.

Title Page, in Field (56), under "U.S. PATENT DOCUMENTS", in Column 2, Line 4, delete "Ausserischner" and insert -- Ausseriechner --, therefor.

In Column 9, Line 5, delete "VDC" and insert -- $V_{DC}$ --, therefor.

In Column 11, Line 16, in Claim 5, after "claim 1" insert -- , --.

In Column 12, Line 60, in Claim 24, after "claim 23" delete "." and insert -- , --, therefor.

Signed and Sealed this

Eighteenth Day of December, 2007

JON W. DUDAS
*Director of the United States Patent and Trademark Office*